(12) United States Patent
Chen

(10) Patent No.: US 11,353,928 B2
(45) Date of Patent: Jun. 7, 2022

(54) DISPLAY MODULE AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Xia Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 195 days.

(21) Appl. No.: 16/966,142

(22) PCT Filed: Jun. 22, 2020

(86) PCT No.: PCT/CN2020/097486
§ 371 (c)(1),
(2) Date: Jul. 30, 2020

(87) PCT Pub. No.: WO2021/223297
PCT Pub. Date: Nov. 11, 2021

(65) Prior Publication Data
US 2021/0349501 A1    Nov. 11, 2021

(51) Int. Cl.
| G06F 1/16 | (2006.01) |
| G06F 3/041 | (2006.01) |
| G06F 1/18 | (2006.01) |
| H04M 1/18 | (2006.01) |
| H01L 27/32 | (2006.01) |
| G02F 1/1333 | (2006.01) |

(52) U.S. Cl.
CPC .......... *G06F 1/1656* (2013.01); *G06F 1/189* (2013.01); *G06F 3/0412* (2013.01); *H04M 1/185* (2013.01); *G02F 1/13338* (2013.01); *G02F 2201/503* (2013.01); *H01L 27/323* (2013.01)

(58) Field of Classification Search
CPC .... H04M 1/185; G06F 1/626; G06F 1/1637; G06F 1/1656; G06F 1/16; G09G 2340/145; G09G 2340/0492; G09G 2356/00
See application file for complete search history.

(56) References Cited

U.S. PATENT DOCUMENTS

2005/0279165 A1    12/2005    Yuasa

FOREIGN PATENT DOCUMENTS

| CN | 103237097 A | 8/2013 |
| CN | 105823586 A | 8/2016 |
| CN | 109148419 A | 1/2019 |
| CN | 110213411 A | 9/2019 |
| JP | 2005091219 A | 4/2005 |

*Primary Examiner* — Sanjiv D. Patel
(74) *Attorney, Agent, or Firm* — Mark M. Friedman

(57) ABSTRACT

A display module and a display device are provided. A first electromagnetic member is disposed on a middle frame, a second electromagnetic member is disposed under a backplate, and an actuation member controls the first electromagnetic member and the second electromagnetic member to work, generating an electromagnetic force generated between the first electromagnetic member and the second electromagnetic member, thereby subjecting the display module to an electromagnetic force opposite to an impact force. Therefore, the display module remains undamaged by an impact and can continue normal operation.

20 Claims, 3 Drawing Sheets

DISPLAY MODULE AND DISPLAY DEVICE

FIELD OF INVENTION

The present disclosure relates to the field of display technologies, and more particularly, to a display module and a display device.

BACKGROUND OF INVENTION

Current display technologies are developing toward flexible and bendable displays. Since flexible and bendable organic light-emitting diode (OLED) display devices have advantages of rich colors, low power consumption, wide viewing angles, lightweight-ness and thinness, they are widely used. In these flexible and bendable OLED display devices, because it is necessary to achieve bendability, light, thin, and flexible materials will be used to manufacture these flexible and bendable OLED display devices. However, these materials have poorer bending resistances, which will cause excessive local stresses in these flexible and bendable OLED display devices during a test process, thereby causing the flexible and bendable OLED display devices to lose effectiveness.

Therefore, current flexible and bendable OLED display devices have a technical problem of poorer impact resistances which cause the flexible and bendable OLED display devices to lose effectiveness.

Technical problem: an embodiment of the present disclosure provides a display module and a display device to solve the technical problem of poorer impact resistances existing in flexible and bendable OLED display devices and causing the flexible and bendable OLED display devices to lose effectiveness.

SUMMARY OF INVENTION

To solve the above problem, an embodiment of the present disclosure provides technical solutions as follows:

An embodiment of the present disclosure provides a display module. The display module includes:
 a middle frame;
 a backplate disposed on the middle frame; and
 a display panel disposed on the backplate;
 wherein a first electromagnetic member is disposed on the middle frame, an infrared transceiver member and an actuation member are disposed on side surfaces of the middle frame, a second electromagnetic member is disposed under the backplate, the infrared transceiver member is connected to the actuation member and is used to send a warning signal to the actuation member when the display module is subjected to an impact, and the actuation member is used to drive the first electromagnetic member and the second electromagnetic member to work after receiving the warning signal.

In some embodiments, the first electromagnetic member and the second electromagnetic member are the same.

In some embodiments, the first electromagnetic member includes a first electromagnetic layer including patterned first electromagnetic blocks and patterned second electromagnetic blocks, the first electromagnetic blocks are connected through first wirings, the second electromagnetic blocks are connected through second wirings, the first electromagnetic blocks and the second electromagnetic blocks are arranged crosswise on a same layer, the first electromagnetic blocks are insulated from the second electromagnetic blocks, and the first wirings and the second wirings are disposed on different layers.

In some embodiments, a shape of the first electromagnetic blocks includes one of rhombic, rectangular, or circular.

In some embodiments, the display panel includes a plurality of pixels arranged in an array, the pixels include sub-pixels, and a cross-sectional area of the first electromagnetic blocks ranges from one third to one half of an area of the sub-pixels.

In some embodiments, the first electromagnetic member includes a first electromagnetic layer and a second electromagnetic layer, the first electromagnetic layer includes patterned first electromagnetic blocks and first wirings, and the second electromagnetic layer includes patterned second electromagnetic blocks and second wirings.

In some embodiments, a material of the first electromagnetic member includes one of ferrite or graphene.

In some embodiments, the infrared transceiver member includes an infrared emitting member, an infrared receiving member, and a signal emitting member, the infrared emitting member is used to emit an infrared ray, the infrared receiving member is used to receive the infrared ray and determine a distance and a position of the infrared ray, and the signal emitting member is used to send the warning signal and the position of the infrared ray to the actuation member when the distance of the infrared ray is outside a default range.

In some embodiments, the middle frame includes an upper side, a lower side, a left side, and a right side, the infrared emitting member includes a first infrared emitting member and a second infrared emitting member, the infrared receiving member includes a first infrared receiving member and a second infrared receiving member, the first infrared emitting member is disposed on the left side of the middle frame, the second infrared emitting member is disposed on the upper side of the middle frame, the first infrared receiving member is disposed on the right side of the middle frame, and the second infrared receiving member is disposed on the lower side of the middle frame.

In some embodiments, the actuation member includes a driver chip.

At a same time, an embodiment of the present disclosure provides a display device. The display panel includes:
 a display module including a middle frame, a backplate, and a display panel, wherein the backplate is disposed on the middle frame, and the display panel is disposed on the backplate; wherein a first electromagnetic member is disposed on the middle frame, an infrared transceiver member and an actuation member are disposed on side surfaces of the middle frame, a second electromagnetic member is disposed under the backplate, the infrared transceiver member is connected to the actuation member and is used to send a warning signal to the actuation member when the display module is subjected to an impact, and the actuation member is used to drive the first electromagnetic member and the second electromagnetic member to work after receiving the warning signal;
 a polarizer disposed on the display module;
 a touch panel disposed on the polarizer; and
 a cover plate disposed on the touch panel.

In some embodiments, the first electromagnetic member and the second electromagnetic member are the same.

In some embodiments, the first electromagnetic member includes a first electromagnetic layer including patterned first electromagnetic blocks and patterned second electromagnetic blocks, the first electromagnetic blocks are connected through first wirings, the second electromagnetic blocks are connected through second wirings, the first electromagnetic blocks and the second electromagnetic blocks are arranged crosswise on a same layer, the first electromagnetic blocks are insulated from the second electromagnetic blocks, and the first wirings and the second wirings are disposed on different layers.

In some embodiments, a shape of the first electromagnetic blocks includes one of rhombic, rectangular, or circular.

In some embodiments, the display panel includes a plurality of pixels arranged in an array, the pixels include sub-pixels, and a cross-sectional area of the first electromagnetic blocks ranges from one third to one half of an area of the sub-pixels.

In some embodiments, the first electromagnetic member includes a first electromagnetic layer and a second electromagnetic layer, the first electromagnetic layer includes patterned first electromagnetic blocks and first wirings, and the second electromagnetic layer includes patterned second electromagnetic blocks and second wirings.

In some embodiments, a material of the first electromagnetic member includes one of ferrite or graphene.

In some embodiments, the infrared transceiver member includes an infrared emitting member, an infrared receiving member, and a signal emitting member, the infrared emitting member is used to emit an infrared ray, the infrared receiving member is used to receive the infrared ray and determine a distance and a position of the infrared ray, and the signal emitting member is used to send the warning signal and the position of the infrared ray to the actuation member when the distance of the infrared ray is outside a default range.

In some embodiments, the middle frame includes an upper side, a lower side, a left side, and a right side, the infrared emitting member includes a first infrared emitting member and a second infrared emitting member, the infrared receiving member includes a first infrared receiving member and a second infrared receiving member, the first infrared emitting member is disposed on the left side of the middle frame, the second infrared emitting member is disposed on the upper side of the middle frame, the first infrared receiving member is disposed on the right side of the middle frame, and the second infrared receiving member is disposed on the lower side of the middle frame.

In some embodiments, the display panel is an OLED display panel or a liquid crystal display panel.

Beneficial effect: an embodiment of the present disclosure provides a display module and a display device. The display module includes a middle frame, a backplate, and a display panel, wherein the backplate is disposed on the middle frame, and the display panel is disposed on the backplate. Wherein, a first electromagnetic member is disposed on the middle frame, an infrared transceiver member and an actuation member are disposed on side surfaces of the middle frame, a second electromagnetic member is disposed under the backplate, the infrared transceiver member is connected to the actuation member and is used to send a warning signal to the actuation member when the display device is subjected to an impact, and the actuation member is used to drive the first electromagnetic member and the second electromagnetic member to work after receiving the warning signal. Through disposing the first electromagnetic member on the middle frame, disposing the infrared transceiver member and the actuation member on the side surfaces of the middle frame, and disposing the second electromagnetic member under the backplate, when the infrared transceiver member detects that the display module is subjected to an impact, the actuation member will control the first electromagnetic member and the second electromagnetic member to work, making an electromagnetic force generated between the first electromagnetic member and the second electromagnetic member, thereby making the display module subjected to the electromagnetic force which is opposite to the impact. Therefore, the display module will not be damaged by the impact and can work normally.

DETAILED DESCRIPTION OF PREFERRED EMBODIMENTS

The present disclosure provides a display module and a display device. In order to make the purpose, technical solutions, and effects of this disclosure clearer and more definite, the following further describes this disclosure in detail with reference to the drawings and embodiments. It should be understood that the specific embodiments described herein are only used to explain the disclosure, and are not used to limit the disclosure.

An embodiment of the present disclosure solves the technical problem of poorer impact resistances existing in flexible and bendable OLED display devices and causing the flexible and bendable OLED display devices to be invalid.

Figure 1:
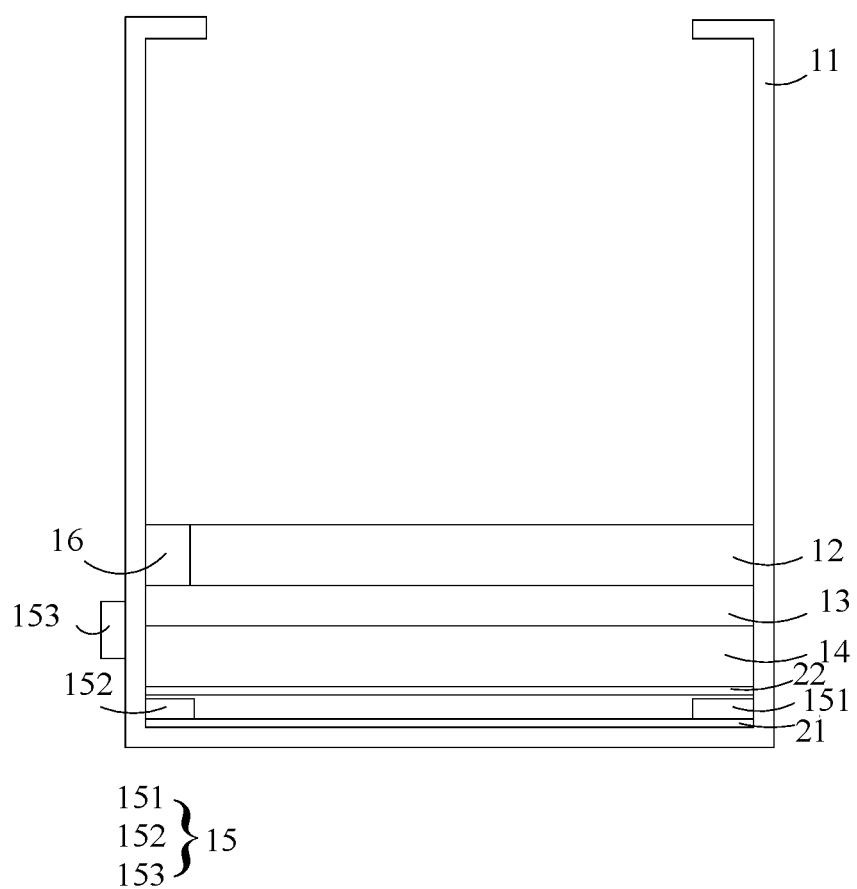
FIG. 1 is a schematic diagram of a display module according to an embodiment of the present disclosure.

As shown in FIG. 1, an embodiment of the present disclosure provides a display module. The display module includes:

a middle frame 11;

a backplate 14 disposed on the middle frame 11; and a display panel 12 disposed on the backplate 14;

wherein a first electromagnetic member 21 is disposed on the middle frame 11, an infrared transceiver member 15 and an actuation member 16 are disposed on side surfaces of the middle frame 11, a second electromagnetic member 22 is disposed under the backplate 14, the infrared transceiver member 15 is connected to the actuation member 16 and is used to send a warning signal to the actuation member 16 when the display module is subjected to an impact, and the actuation member 16 is used to drive the first electromagnetic member 21 and the second electromagnetic member 22 to work after receiving the warning signal.

The embodiment of the present disclosure provides the display module. The display module includes the middle frame, the backplate, and the display panel, wherein the backplate is disposed on the middle frame, and the display panel is disposed on the backplate. Wherein, the first electromagnetic member is disposed on the middle frame, the infrared transceiver member and the actuation member are disposed on the side surfaces of the middle frame, the second electromagnetic member is disposed under the backplate, the infrared transceiver member is connected to the actuation member and is used to send a warning signal to the actuation member when the display device is subjected to an impact, and the actuation member is used to drive the first electromagnetic member and the second electromagnetic member to work after receiving the warning signal. By disposing the first electromagnetic member on the middle frame, disposing the infrared transceiver member and the actuation member on the side surfaces of the middle frame, and disposing the second electromagnetic member under the backplate, when the infrared transceiver member detects that the display module is subjected to an impact, the actuation member will control the first electromagnetic member and the second electromagnetic member to work, generating an electromagnetic force between the first electromagnetic member and the second electromagnetic member, thereby subjecting the display module to an electromagnetic force opposite to the impact. Therefore, the display module remains undamaged by the impact and can continue normal operation.

In an embodiment, the first electromagnetic member and the second electromagnetic member electromagnetic member are the same. By making the first electromagnetic member the same as the second electromagnetic member, a size of energized areas between corresponding electromagnetic members coincide, which can make electromagnetic forces within a predetermined area counteract impact forces, thereby protecting the display module from being damaged by impact forces. Therefore, each film layer in the display module can remain intact, and each wiring and each electrode remain unbroken, thereby ensuring normal operation of the display module.

Figure 2:
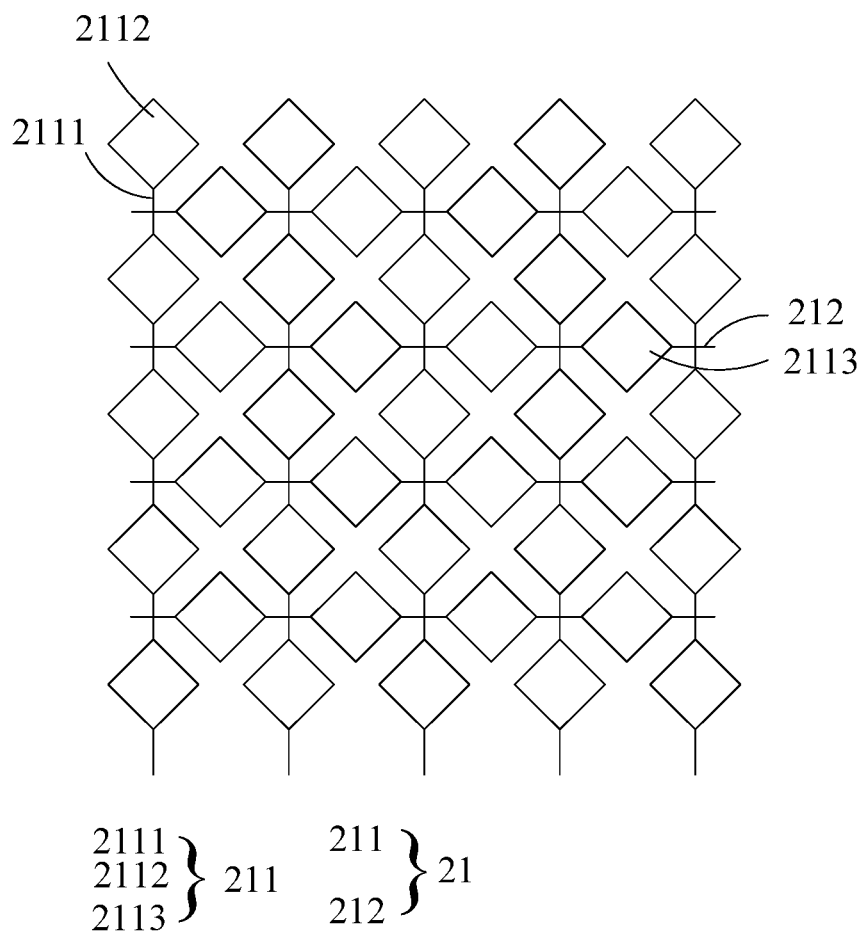
FIG. 2 is a schematic diagram of a first electromagnetic member according to an embodiment of the present disclosure.

In an embodiment, as shown in FIG. 2, the first electromagnetic member 21 includes a first electromagnetic layer 211 including patterned first electromagnetic blocks 2112 and patterned second electromagnetic blocks 2113, the first electromagnetic blocks 2112 are connected through first wirings 2111, the second electromagnetic blocks 2113 are connected through second wirings 212, the first electromagnetic blocks 2112 and the second electromagnetic blocks 2113 are arranged crosswise on a same layer, the first electromagnetic blocks 2112 are insulated from the second electromagnetic blocks 2113, and the first wirings 2111 and the second wirings 212 are disposed on different layers. In FIG. 2, the first wirings 2111 are formed by patterning the first electromagnetic layer 211, and the second wirings 212 are disposed on another layer. Through disposing the first electromagnetic blocks and the second electromagnetic blocks on the same layer, space can be saved and a thickness of the first electromagnetic member can be reduced. Meanwhile, the first electromagnetic blocks and the second electromagnetic blocks are arranged crosswise, which can make the first electromagnetic blocks and the second electromagnetic blocks to generate electromagnetic forces in an area precisely, thereby precisely counteracting the impact.

In an embodiment, a shape of the first electromagnetic blocks includes one of rhombic, rectangular, or circular. In dispositions of the first electromagnetic blocks, the shape of the first electromagnetic blocks is not limited, and the first electromagnetic blocks can also be other shapes, which can ensure the first electromagnetic blocks to generate the electromagnetic forces in specific areas and ensure normal operation of the display module.

In an embodiment, a shape of the second electromagnetic blocks includes one of rhombic, rectangular, or circular. The first electromagnetic blocks and the second electromagnetic blocks may be the same, and a shape setting of the second electromagnetic blocks may be the same as the first electromagnetic blocks. The first electromagnetic blocks and the second electromagnetic blocks ensure each area and provide electricity to each area to generate the electromagnetic forces and to counteract the impact, thereby allowing normal operation of the display module.

In the embodiment, the first electromagnetic member and the second electromagnetic member are the same, so the second electromagnetic member may also consist of two electromagnetic layers and two layers of wirings. Also, the shape of the second electromagnetic member may also include rhombic, rectangular, or circular, but the embodiment of the present disclosure is not limited to this. The first electromagnetic member and the second electromagnetic member may also be different.

In an embodiment, the display panel includes a plurality of pixels arranged in an array, the pixels include sub-pixels, and a cross-sectional area of the first electromagnetic blocks ranges from one third to one half of an area of the sub-pixels. When patterning the first electromagnetic blocks, the cross-sectional areas of the first electromagnetic blocks may be made to be one third to one half of the areas of the sub-pixels. That is, the first electromagnetic blocks are disposed in each sub-pixel area when the first electromagnetic blocks are disposed. Therefore, when an area subjected to an impact is detected, an electromagnetic block corresponding to a sub-pixel will be energized according to a position of the sub-pixel and generates an electromagnetic force to counteract the impact in this area without affecting other areas, thereby ensuring that the display module is undamaged when the impact is counteracted.

In an embodiment, the electromagnetic blocks are square, and widths of the electromagnetic blocks range from 100 Å to 1000 Å.

In an embodiment, the display panel includes a touch layer, the touch layer includes sense electrodes and drive electrodes arranged in an array, and cross-sectional areas of the first electromagnetic blocks are equal to cross-sectional areas of the sense electrodes. In a size setting process of the first electromagnetic blocks, the cross-sectional areas of the first electromagnetic blocks may be set according to the cross-sectional areas of the sense electrodes in the touch layer. Therefore, according to a position of a corresponding sense electrode, a corresponding first electromagnetic block can be controlled to be energized and generate an electromagnetic force to counteract impact, and meanwhile, the position is ensured to be accurate without affecting other areas, but the embodiment of the present disclosure is not limited to this, which may also have the cross-sectional areas of the first electromagnetic blocks to be the same as cross-sectional areas of the drive electrodes.

In an embodiment, the first electromagnetic member includes a first electromagnetic layer and a second electromagnetic layer, the first electromagnetic layer includes patterned first electromagnetic blocks and first wirings, and the second electromagnetic layer includes patterned second electromagnetic blocks and second wirings. By disposing the first electromagnetic member as the first electromagnetic layer and the second electromagnetic layer and patterning the first electromagnetic layer and the second electromagnetic layer to form electromagnetic blocks, when an area of the display module is subjected to an impact, the area will be energized, which makes the first electromagnetic member generate an opposite electromagnetic force to the impact in the area, thereby counteracting the impact in the area and ensuring film layers in the area to be intact. Meanwhile, a structure of each film layer in the area will not be damaged, thereby ensuring normal operation of the display module.

In an embodiment, a material of the first electromagnetic member includes one of ferrite or graphene. Using ferrite and graphene as the material of the first electromagnetic member can generate electromagnetic forces to counteract the impact, but the material of the first electromagnetic member is not limited to this and may be other materials which can generate the electromagnetic forces. Meanwhile, a material of the second electromagnetic member may also be any one of the above materials.

In an embodiment, as shown in FIG. 1, the infrared transceiver member 15 includes an infrared emitting member 151, an infrared receiving member 152, and a signal emitting member 153, the infrared emitting member 151 is used to emit an infrared ray, the infrared receiving member 152 is used to receive the infrared ray and determine a distance and a position of the infrared ray, and the signal emitting member 153 is used to send the warning signal and the position of the infrared ray to the actuation member 16 when the distance of the infrared ray is outside a default range. When the infrared transceiver member is used to determine if the display module is subjected to an impact, by generating an infrared ray via the infrared emitting member, according to a distance between the infrared receiving member and the display module, whether the distance has changed can be determined. For example, the distance between the infrared receiving member and the display module is 1, and the distance between the infrared receiving member and the display module can be calculated by a receiving time of a received infrared ray. When the distance is less than 1, a default range can be set, for example, the default range ranges from 0.95 to 0.97, and when the distance is less than the default range, the display module is determined to be subjected to an impact, and makes the signal emitting member send a signal, thereby making the actuation member control the first electromagnetic member and second electromagnetic member to generate an electromagnetic force, thereby counteracting the impact and allowing normal operation of the display module.

In an embodiment, the middle frame includes an upper side, a lower side, a left side, and a right side, the infrared emitting member includes a first infrared emitting member and a second infrared emitting member, the infrared receiving member includes a first infrared receiving member and a second infrared receiving member, the first infrared emitting member is disposed on the left side of the middle frame, the second infrared emitting member is disposed on the upper side of the middle frame, the first infrared receiving member is disposed on the right side of the middle frame, and the second infrared receiving member is disposed on the lower side of the middle frame. A set of infrared transceiver members can be disposed on the upper side and the lower side of the middle frame, and another set of infrared transceiver members can be disposed on the left side and the right side of the middle frame. Therefore, the two sets of infrared transceiver members can more accurately determine a location of an impact, and a reaction can be made to a corresponding area, thereby making a corresponding reaction to the display module.

It should be noted that when disposing the infrared emitting member and the infrared receiving member, a set of infrared emitting member and infrared receiving member is disposed as shown in FIG. 1, and another set of infrared emitting member and infrared receiving member is disposed on the upper side and the lower side, which is disposed inside and outside the screen in FIG. 1 and can only show a point, so it is not indicated in FIG. 1.

In an embodiment, in a working process of the infrared emitting member and the infrared receiving member, the infrared emitting member emits an infrared ray to the infrared receiving member, and when the display module is subjected to an impact, the display module will be deformed, which causes the display module to shield a part of transmission of the infrared ray, thereby the infrared receiving member unable to receive the part of the infrared ray.

Through disposing two sets of infrared emitting members and infrared receiving members, a position subjected to the impact can be determined accurately, that is, taking a coordinate axis as an example, a set of infrared emitting member and infrared receiving member is equivalent to determine the abscissa, another set of infrared emitting member and infrared receiving member is equivalent to determine the ordinate, thereby accurately determining the position of impact.

In an embodiment, the actuation member includes a driver chip. As shown in FIG. 1, the driver chip may be a driver chip which is connected to and drives the display panel in the display module or may be a newly added driver chip disposed in bezels of the display module and driving the first electromagnetic member and the second electromagnetic member.

Figure 3:
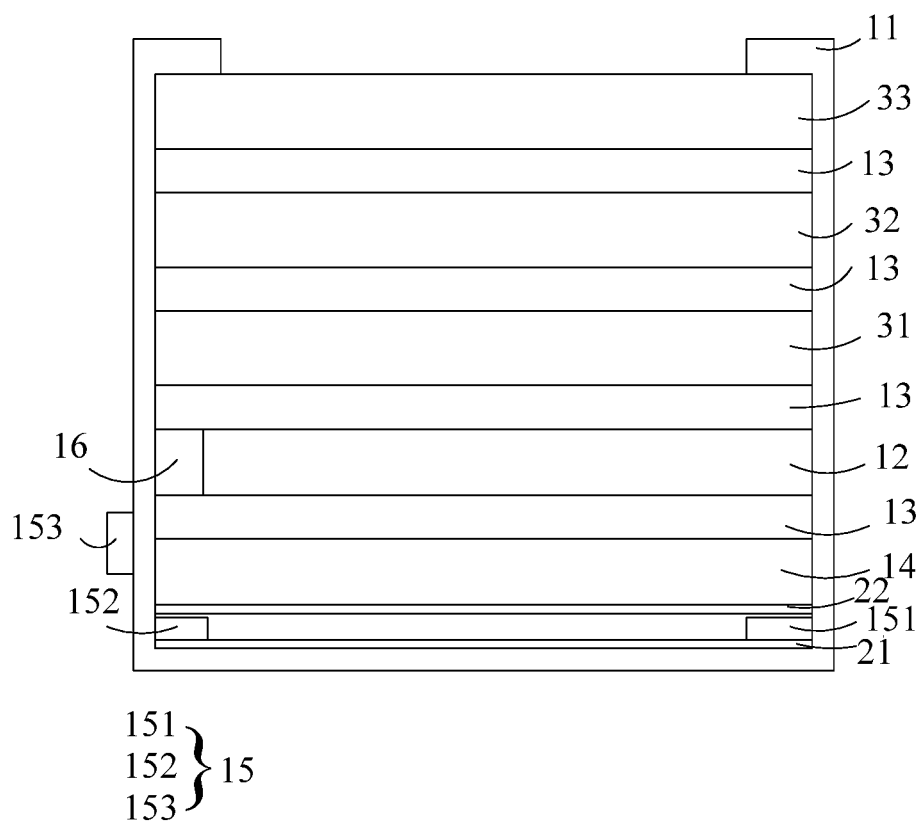
FIG. 3 is a schematic diagram of a display device according to an embodiment of the present disclosure.

As shown in FIG. 3, an embodiment of the present disclosure provides a display device. The display device includes:

a display module including a middle frame 11, a backplate 14, and a display panel 12, wherein the backplate 14 is disposed on the middle frame 11, and the display panel 12 is disposed on the backplate 14; wherein a first electromagnetic member 21 is disposed on the middle frame 11, an infrared transceiver member 15 and an actuation member 16 are disposed on side surfaces of the middle frame 11, a second electromagnetic member 22 is disposed under the backplate 14, the infrared transceiver member 15 is connected to the actuation member 16 and is used to send a warning signal to the actuation member 16 when the display module is subjected to an impact, and the actuation member 16 is used to drive the first electromagnetic member 21 and the second electromagnetic member 22 to work after receiving the warning signal;

a polarizer 31 disposed on the display module;

a touch panel 32 disposed on the polarizer 31; and a cover plate 33 disposed on the touch panel 32.

The embodiment of the present disclosure provides the display device. The display device includes the display module, the polarizer, the touch panel, and the cover plate. The display module includes the middle frame, the backplate, and the display panel, wherein the backplate is disposed on the middle frame, and the display panel is disposed on the backplate. Wherein, the first electromagnetic member is disposed on the middle frame, the infrared transceiver member and the actuation member are disposed on the side surfaces of the middle frame, the second electromagnetic member is disposed under the backplate, the infrared transceiver member is connected to the actuation member and is used to send a warning signal to the actuation member when the display device is subjected to an impact, and the actuation member is used to drive the first electromagnetic member and the second electromagnetic member to work after receiving the warning signal. By disposing the first electromagnetic member on the middle frame, disposing the infrared transceiver member and the actuation member on the side surfaces of the middle frame, and disposing the second electromagnetic member under the backplate, when the infrared transceiver member detects that the display module is subjected to an impact, the actuation member will control the first electromagnetic member and the second electromagnetic member to work, generating an electromagnetic force between the first electromagnetic member and the second electromagnetic member, thereby subjecting the display module to the electromagnetic force opposite to the impact. Therefore, the display module remains undamaged by the impact and can continue normal operation.

In an embodiment of the present disclosure, as shown in FIGS. 1 and 3, an adhesive layer 13 is disposed between the display panel 12 and the backplate 14, an adhesive layer 13 is disposed between the display panel 12 and the polarizer 31, an adhesive layer 13 is disposed between the polarizer 31 and the touch panel 32, and an adhesive layer 13 is disposed between the touch panel 32 and the cover plate 33. The adhesive layers among the display panel, the polarizer, the touch panel, and the cover plate can be the same, but the embodiment of the present disclosure is not limited to this, and the adhesive layers among the display panel, the polarizer, the touch panel, and the cover plate can be different.

In an embodiment, in the display device, the first electromagnetic member and the second electromagnetic member are the same.

In an embodiment, in the display device, the first electromagnetic member includes a first electromagnetic layer including patterned first electromagnetic blocks and patterned second electromagnetic blocks, the first electromagnetic blocks are connected through first wirings, the second electromagnetic blocks are connected through second wirings, the first electromagnetic blocks and the second electromagnetic blocks are arranged crosswise on a same layer, the first electromagnetic blocks are insulated from the second electromagnetic blocks, and the first wirings and the second wirings are disposed on different layers.

In an embodiment, in the display device, a shape of the first electromagnetic blocks includes one of rhombic, rectangular, or circular.

In an embodiment, in the display device, the display panel includes a plurality of pixels arranged in an array, the pixels include sub-pixels, and a cross-sectional area of the first electromagnetic blocks ranges from one third to one half of an area of the sub-pixels.

In an embodiment, in the display device, the first electromagnetic member includes a first electromagnetic layer and a second electromagnetic layer, the first electromagnetic layer includes patterned first electromagnetic blocks and first wirings, and the second electromagnetic layer includes patterned second electromagnetic blocks and second wirings.

In an embodiment, in the display device, a material of the first electromagnetic member includes one of ferrite or graphene.

In an embodiment, in the display device, the infrared transceiver member includes an infrared emitting member, an infrared receiving member, and a signal emitting member, the infrared emitting member is used to emit an infrared ray, the infrared receiving member is used to receive the infrared ray and determine a distance and a position of the infrared ray, and the signal emitting member is used to send the warning signal and the position of the infrared ray to the actuation member when the distance of the infrared ray is outside a default range.

In an embodiment, in the display device, the middle frame includes an upper side, a lower side, a left side, and a right side, the infrared emitting member includes a first infrared emitting member and a second infrared emitting member, the infrared receiving member includes a first infrared receiving member and a second infrared receiving member, the first infrared emitting member is disposed on the left side of the middle frame, the second infrared emitting member is disposed on the upper side of the middle frame, the first infrared receiving member is disposed on the right side of the middle frame, and the second infrared receiving member is disposed on the lower side of the middle frame.

In an embodiment, in the display device, the display panel is an OLED display panel or a liquid crystal display panel.

It can be known according to the above embodiments:

An embodiment of the present disclosure provides a display module and a display device. The display module includes a middle frame, a backplate, and a display panel, wherein the backplate is disposed on the middle frame, and the display panel is disposed on the backplate. Wherein, a first electromagnetic member is disposed on the middle frame, an infrared transceiver member and an actuation member are disposed on side surfaces of the middle frame, a second electromagnetic member is disposed under the backplate, the infrared transceiver member is connected to the actuation member and is used to send a warning signal to the actuation member when the display device is subjected to an impact, and the actuation member is used to drive the first electromagnetic member and the second electromagnetic member to work after receiving the warning signal. By disposing the first electromagnetic member on the middle frame, disposing the infrared transceiver member and the actuation member on the side surfaces of the middle frame, and disposing the second electromagnetic member under the backplate, when the infrared transceiver member detects that the display module is subjected to an impact, the actuation member will control the first electromagnetic member and the second electromagnetic member to work, generating an electromagnetic force between the first electromagnetic member and the second electromagnetic member, thereby subjecting the display module to the electromagnetic force opposite to the impact. Therefore, the display module remains undamaged by the impact and can continue normal operation.

It can be understood that for a person of ordinary skill in the art, equivalent replacements or changes can be made according to the technical solution of the present disclosure and its inventive concept, and all these changes or replacements should fall within the protection scope of the claims attached to the present disclosure.

What is claimed is:

1. A display module, comprising:
a middle frame;
a backplate disposed on the middle frame; and
a display panel disposed on the backplate;
wherein a first electromagnetic member is disposed on the middle frame, an infrared transceiver member and an actuation member are disposed on side surfaces of the middle frame, a second electromagnetic member is disposed under the backplate, the infrared transceiver member is connected to the actuation member and is used to send a warning signal to the actuation member when the display module is subjected to an impact, and the actuation member is used to drive the first electromagnetic member and the second electromagnetic member to work after receiving the warning signal.

2. The display module according to claim 1, wherein the first electromagnetic member and the second electromagnetic member are the same.

3. The display module according to claim 2, wherein the first electromagnetic member comprises a first electromagnetic layer comprising patterned first electromagnetic blocks and patterned second electromagnetic blocks, the first electromagnetic blocks are connected through first wirings, the second electromagnetic blocks are connected through second wirings, the first electromagnetic blocks and the second electromagnetic blocks are arranged crosswise on a same layer, the first electromagnetic blocks are insulated from the second electromagnetic blocks, and the first wirings and the second wirings are disposed on different layers.

4. The display module according to claim 3, wherein a shape of the first electromagnetic blocks comprises one of rhombic, rectangular, or circular.

5. The display module according to claim 3, wherein the display panel comprises a plurality of pixels arranged in an array, the pixels comprise sub-pixels, and a cross-sectional area of the first electromagnetic blocks ranges from one third to one half of an area of the sub-pixels.

6. The display module according to claim 2, wherein the first electromagnetic member comprises a first electromagnetic layer and a second electromagnetic layer, the first electromagnetic layer comprises patterned first electromagnetic blocks and first wirings, and the second electromagnetic layer comprises patterned second electromagnetic blocks and second wirings.

7. The display module according to claim 2, wherein a material of the first electromagnetic member comprises one of ferrite or graphene.

8. The display module according to claim 1, wherein the infrared transceiver member comprises an infrared emitting member, an infrared receiving member, and a signal emitting member, the infrared emitting member is used to emit an infrared ray, the infrared receiving member is used to receive the infrared ray and determine a distance and a position of the infrared ray, and the signal emitting member is used to send the warning signal and the position of the infrared ray to the actuation member when the distance of the infrared ray is outside a default range.

9. The display module according to claim 8, wherein the middle frame comprises an upper side, a lower side, a left side, and a right side, the infrared emitting member comprises a first infrared emitting member and a second infrared emitting member, the infrared receiving member comprises a first infrared receiving member and a second infrared receiving member, the first infrared emitting member is disposed on the left side of the middle frame, the second infrared emitting member is disposed on the upper side of the middle frame, the first infrared receiving member is disposed on the right side of the middle frame, and the second infrared receiving member is disposed on the lower side of the middle frame.

10. The display module according to claim 1, wherein the actuation member comprises a driver chip.

11. A display device, comprising:
a display module comprising a middle frame, a backplate, and a display panel, wherein the backplate is disposed on the middle frame, and the display panel is disposed on the backplate; wherein a first electromagnetic member is disposed on the middle frame, an infrared transceiver member and an actuation member are disposed on side surfaces of the middle frame, a second electromagnetic member is disposed under the backplate, the infrared transceiver member is connected to the actuation member and is used to send a warning signal to the actuation member when the display module is subjected to an impact, and the actuation member is used to drive the first electromagnetic member and the second electromagnetic member to work after receiving the warning signal;
a polarizer disposed on the display module;
a touch panel disposed on the polarizer; and
a cover plate disposed on the touch panel.

12. The display device according to claim 11, wherein the first electromagnetic member and the second electromagnetic member are same.

13. The display device according to claim 12, wherein the first electromagnetic member comprises a first electromagnetic layer comprising patterned first electromagnetic blocks and patterned second electromagnetic blocks, the first electromagnetic blocks are connected through first wirings, the second electromagnetic blocks are connected through second wirings, the first electromagnetic blocks and the second electromagnetic blocks are arranged crosswise on a same layer, the first electromagnetic blocks are insulated from the second electromagnetic blocks, and the first wirings and the second wirings are disposed on different layers.

14. The display device according to claim 13, wherein a shape of the first electromagnetic blocks comprises one of rhombic, rectangular, or circular.

15. The display device according to claim 13, wherein the display panel comprises a plurality of pixels arranged in an array, the pixels comprise sub-pixels, and a cross-sectional area of the first electromagnetic blocks ranges from one third to one half of an area of the sub-pixels.

16. The display device according to claim 12, wherein the first electromagnetic member comprises a first electromagnetic layer and a second electromagnetic layer, the first electromagnetic layer comprises patterned first electromagnetic blocks and first wirings, and the second electromagnetic layer comprises patterned second electromagnetic blocks and second wirings.

17. The display device according to claim 12, wherein a material of the first electromagnetic member comprises one of ferrite or graphene.

18. The display device according to claim 11, wherein the infrared transceiver member comprises an infrared emitting member, an infrared receiving member, and a signal emitting member, the infrared emitting member is used to emit an infrared ray, the infrared receiving member is used to receive the infrared ray and determine a distance and a position of the infrared ray, and the signal emitting member is used to send the warning signal and the position of the infrared ray to the actuation member when the distance of the infrared ray is outside a default range.

19. The display device according to claim 18, wherein the middle frame comprises an upper side, a lower side, a left side, and a right side, the infrared emitting member comprises a first infrared emitting member and a second infrared emitting member, the infrared receiving member comprises a first infrared receiving member and a second infrared receiving member, the first infrared emitting member is disposed on the left side of the middle frame, the second infrared emitting member is disposed on the upper side of the middle frame, the first infrared receiving member is disposed on the right side of the middle frame, and the second infrared receiving member is disposed on the lower side of the middle frame.

20. The display device according to claim 11, wherein the display panel is an organic light-emitting diode (OLED) display panel or a liquid crystal display panel.

* * * * *